(12) United States Patent
Jacobsson et al.

(10) Patent No.: US 12,156,340 B2
(45) Date of Patent: Nov. 26, 2024

(54) LONG-STROKE FEEDING MECHANISM

(71) Applicant: Mycronic AB, Taby (SE)

(72) Inventors: Nils Jacobsson, Kungsagen (SE); Peter Sundstrom, Solna (SE); Bobbi Ferm, Sollentuna (SE)

(73) Assignee: Mycronic AB, Taby (SE)

( * ) Notice: Subject to any disclaimer, the term of this patent is extended or adjusted under 35 U.S.C. 154(b) by 641 days.

(21) Appl. No.: 17/312,139

(22) PCT Filed: Dec. 9, 2019

(86) PCT No.: PCT/EP2019/084174
§ 371 (c)(1),
(2) Date: Jun. 9, 2021

(87) PCT Pub. No.: WO2020/120377
PCT Pub. Date: Jun. 18, 2020

(65) Prior Publication Data
US 2022/0046837 A1 Feb. 10, 2022

(30) Foreign Application Priority Data

Dec. 11, 2018 (SE) .................... 1851547-8

(51) Int. Cl.
*H05K 13/02* (2006.01)
*H05K 13/04* (2006.01)

(52) U.S. Cl.
CPC ....... *H05K 13/021* (2013.01); *H05K 13/0419* (2018.08)

(58) Field of Classification Search
CPC .............................. H05K 13/0419; B65H 20/20

USPC ............................................ 226/57, 67, 120
See application file for complete search history.

(56) References Cited

U.S. PATENT DOCUMENTS

| 5,339,939 A * | 8/1994 | Gueble ............. H05K 13/0417 198/803.14 |
| 7,243,828 B2 * | 7/2007 | Ricketson ............. B65H 20/22 226/57 |
| 2004/0200578 A1 * | 10/2004 | Ju ..................... H05K 13/0417 156/767 |
| 2015/0075724 A1 | 3/2015 | Karlsson et al. |

OTHER PUBLICATIONS

International Search Report PCT/ISA/210 for International Application No. PCT/EP2019/084174 Dated Feb. 28, 2020.

* cited by examiner

*Primary Examiner* — Michael McCullough
*Assistant Examiner* — Molly K Devine
(74) *Attorney, Agent, or Firm* — Harness, Dickey & Pierce, P.L.C.

(57) ABSTRACT

A method of feeding a component tape towards a picking position of a component mounting machine is disclosed. The feeding is performed by means of a feeding mechanism configured to engage the component tape at an engaging position and to disengage the component tape at a disengaging position. The method comprises engaging the component tape at the engaging position, moving, by means of the feeding mechanism, the component tape from the engaging position to the disengaging position, disengaging the component tape at the disengaging position, and returning the feeding mechanism from the disengaging position to the engaging position and wherein the feeding mechanism moves the component tape in a linear motion between the engaging position and the disengaging position.

11 Claims, 4 Drawing Sheets

LONG-STROKE FEEDING MECHANISM

CROSS-REFERENCE TO RELATED APPLICATION

This application is a national phase under 35 U.S.C. § 371 of PCT International Application No. PCT/EP2019/084174 which has an International filing date of Dec. 9, 2019, which claims priority to Swedish Application No. 1851547-8, filed Dec. 11, 2018, the entire contents of each of which are hereby incorporated by reference.

TECHNICAL FIELD

The present inventive concept relates to the field of manufacture and assembly of circuit card assemblies. In particular, the present inventive concept relates to a method of feeding a component tape towards a picking position of a component mounting machine, and to a device for performing said feeding.

BACKGROUND

Manufacturing of circuit board assemblies typically involves a component mounting machine, such as a pick-and-place machine, for placing the component on a designated position on a workpiece, such as a printed circuit board (PCB). The components are typically provided in a component tape, which is fed to a picking position of the component mounting machine by means of a feeding mechanism. Concepts seen in prior art are aimed at improving the loading of the component tape into the component mounting machine, increasing the speed of the component mounting process, and reducing the number of components discarded due to erroneous picking.

One example of such concepts relates to a component feeding device utilising a sprocket wheel for engaging and moving the component tape. The sprocket wheel is arranged such that its teeth can engage perforations of the component tape and move the tape forward with the rotation of the wheel. Even though such a device allows for the components to be fed to the picking position, there is still a need for a technology allowing the components to be fed to the picking position at higher speed and improved precision.

SUMMARY

In view of the above, an object of the present inventive concept is to provide a technology that addresses at least some of the above concerns. This and other objects, which will become apparent in the following, are accomplished by a method and a device as defined in the independent claims. Preferable embodiments are defined in the dependent claims.

According to a first aspect of the present inventive concept, there is provided a method of feeding a component tape towards a picking position of a component mounting machine by means of a feeding mechanism configured to engage the component tape at an engaging position and to disengage the component tape at a disengaging position. The method comprises:
 engaging the component tape at the engaging position;
 moving, by means of the feeding mechanism, the component tape from the engaging position to the disengaging position;
 disengaging the component tape at the disengaging position; and
 returning the feeding mechanism from the disengaging position to the engaging position;
 wherein the feeding mechanism is configured to provide at least two sequentially arranged compartments of the component tape to the picking position before the feeding mechanism returns to the engaging position and wherein the feeding mechanism moves the component tape in a linear motion between the engaging position and the disengaging position.

As a configuration of the first aspect, there is provided a method of feeding a component tape towards a picking position of a component mounting machine by means of a feeding mechanism configured to engage the component tape at an engaging position and to disengage the component tape at a disengaging position. The method comprises:
 engaging the component tape at the engaging position;
 moving, by means of the feeding mechanism, the component tape from the engaging position to the disengaging position;
 disengaging the component tape at the disengaging position; and
 returning the feeding mechanism from the disengaging position to the engaging position;
 wherein the feeding mechanism is configured to provide at least two sequentially arranged compartments of the component tape to the picking position before the feeding mechanism returns to the engaging position.

According to a second aspect of the present inventive concept, there is provided a feeding mechanism for feeding a component tape towards a picking position of a component mounting machine. The feeding mechanism comprises an engagement means configured to engage the component tape at an engaging position and disengage the component tape at a disengaging position, and an actuator configured to move the component tape from the engaging position towards a disengaging position. Further, the feeding mechanism is configured to provide at least two sequentially arranged compartments of the component tape to the picking position before the feeding mechanism returns to the engaging position and wherein the feeding mechanism is configured to move the component tape in a linear motion between the engaging position and the disengaging position.

As a configuration of the second aspect, there is provided a feeding mechanism for feeding a component tape towards a picking position of a component mounting machine. The feeding mechanism comprises an engagement means configured to engage the component tape at an engaging position and disengage the component tape at a disengaging position, and an actuator configured to move the component tape from the engaging position towards a disengaging position. Further, the feeding mechanism is configured to provide at least two sequentially arranged compartments of the component tape to the picking position before the feeding mechanism returns to the engaging position The device of the second aspect may thus be used to perform the steps defined in the method of the first aspect of the present inventive concept.

According to a third aspect of the present inventive concept, there is provided a component mounting machine comprising a feeding mechanism according to the second aspect of the present inventive concept.

The present inventive concept allows for two or more components to be provided at the picking position before the feeding mechanism has to return to the engaging position. If the operation of the feeding mechanism is considered as a cycle defined by the engaging, moving, disengaging and return actions, the present inventive concept allows for at least two components to be fed to the picking position for each such cycle. Increasing the number of components per cycle allows for an improved component per hour (CPH) rate, particularly for frequently used components, since the feeding mechanism does not have to spend time on returning to the engaging position after each and every pick. Instead, the feeding mechanism provides several components to the picking position during the movement between the engaging position and the disengaging position, Thus, the time required to feed the components can be considerably reduced.

Moreover, by allowing at least two sequentially arranged compartments to be provided to the picking position for each feeding cycle, the average number of engagement and disengagement actions performed on the component tape may be reduced, thereby reducing vibrations induced on the component tape during the engagement and disengagement actions. Such a reduction of vibrations may reduce the risk of malfunction, e.g. incomplete picks, missed picks, and poor positioning precision of the picking process.

A picking position may be understood as the position in which compartments of the component tape are placed to allow the picking head of the component mounting machine to pick the components.

Sequentially arranged compartments, and therefore sequentially arranged components, may be understood as compartments positioned sequentially in a row (one after the other) in the feeding direction, i.e., a length-wise direction, of the component tape.

According to an embodiment, the engagement means may comprise an engaging pin configured to engage and disengage perforations of the component tape. The engaging pin may be a structural feature of the feeding mechanism connecting it to the component tape by means of perforations, e.g. holes, arranged in the component tape. Once engaged with the component tape, the pin allows the component tape to follow the movements performed by the feeding mechanism by means of the actuator. Consequently, the disengagement of the engaging pin from the component tape perforations allows the feeding mechanism to release the component tape and move back to the engaging position.

As discussed above, the feeding mechanism may move the component tape in a linear motion between the engaging position and the disengaging position.

In embodiments of the first aspect, the feeding mechanism is configured to move the engaging means, such as the engaging pin, in a linear motion between the engaging position and the disengaging position. The linear motion may thus be in a direction that is parallel to the feeding direction of the component tape.

The connection made between the component tape and the engaging pin may allow the linear movement of the feeding mechanism to be transferred to the component tape, such that the tape follows a linear motion, described by the feeding system, between the engaging position and the disengaging position. It is realized that the picking position of the component mounting machine may be located between the engaging position and the disengaging position. However, in an alternative embodiment, both the engaging position and the disengaging position may be arranged on the same side of the picking position, i.e., before the picking position or after the picking position as seen in the feeding direction. A linear feeding motion, oriented along the length extension of the component tape, is advantageous in that it reduces vertically oriented forces that may induce vibrations and positioning errors to the component tape. Vertical force components may for example be present in technologies employing rotating sprocket wheels for the feeding of the component tape.

According to an embodiment, the movement of the component tape may be stopped during picking of a component at the picking position. When a compartment and its component reach the picking position, the movement of the component tape may be temporarily stopped at least for the duration of the picking of the component. The movement, and thus the stopping, may be controlled by the actuator operating the feeding mechanism. The duration of the picking may be determined by the time needed for the picking machine to retrieve the component from its compartment on the component tape. This interrupted movement allows for an improved accuracy of the component picking, thereby reducing the risks of false picking (e.g. incomplete pick, missed pick) or other malfunctions of the interaction between the feeding system and the component mounting machine.

According to an embodiment, the pin may have a shape that matches the perforations of the component tape so as to provide a stable and reliable engagement. In one example, the pin may comprise a circular cross section and circumference similar to the circumference of the tape perforations. Further, the feeding mechanism may comprise a plurality of engaging pins, arranged to simultaneously engage and disengage a plurality of component tape perforations, thereby providing an improved and more stable engagement between the component tape and the feeding mechanism.

According to an embodiment, the engaging pin may be configured to move perpendicularly to a feeding direction of the component tape to engage and disengage the component tape. In one example the feeding direction, representing the direction of the movement of the feeding mechanism, extends along a horizontal direction whereas the motions for engagement and disengagement of the component tape follow a vertical direction.

According to an embodiment, a distance between the engaging position and the disengaging position may be determined by a spacing between two adjacent compartments of the component tape. The number of sequentially arranged compartments that are provided to the picking position in the same feeding cycle of the feeding mechanism may also define the distance between the engaging and disengaging positions. In other words, the greater the number of compartments provided to a picking position per cycle, the greater the distance between the engaging and disengaging positions will be. The maximum distance between the engaging and disengaging position may be given by the actual stroke length of the feeding mechanism.

According to some embodiments, the feeding mechanism may comprise one or several actuators for generating and controlling the movements of the feeding mechanism. The actuator(s) may for example include an electric motor, a pressure operated motors, and solenoid. A first one of the actuators may be the actuator arranged to move the component tape from the engaging position towards the disengaging position. In addition to this, a second actuator may be provided to move the engagement means, such as the pin, perpendicularly to the feeding direction of the component tape. The actuators may be configured to generate their respective movements non-simultaneously, following the steps of the method according to the first aspect. In one example, the second actuator provides an ascending vertical movement of the pin to engage the component tape, followed by the first actuator generating the movement of the feeding mechanism along the feeding direction and stopping said movement when compartments of the component tape reach the picking position. The second actuator then generates a descending vertical motion of the pin to disengage the component tape, followed by a return motion of the feeding mechanism from the disengaging position to the engaging position generated by the first actuator.

The invention may be embodied as computer-readable instructions for controlling a programmable computer in such manner that it performs the control method outlined above. Such instructions may be distributed in the form of a computer-program product comprising a computer-readable medium storing the instructions. The computer-readable medium may be a tangible medium such as RAM, ROM, EEPROM, flash memory or other memory technology, CD-ROM, digital versatile disks (DVD) or other optical disk storage, magnetic cassettes, magnetic tape, magnetic disk storage or other magnetic storage devices.

BRIEF DESCRIPTION OF THE DRAWINGS

The above, as well as additional objects, features and advantages of the present invention, will be better understood through the following illustrative and non-limiting detailed description of embodiments of the present invention. Reference will be made to the appended drawings, on which.

DETAILED DESCRIPTION OF EMBODIMENTS

Figure 1:
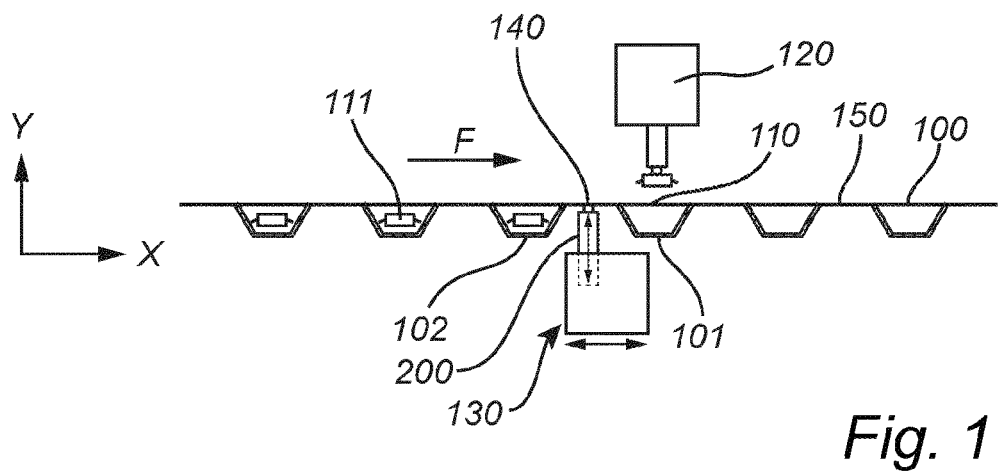
FIG. 1 illustrates a feeding system utilizing the present inventive method and device.

FIG. 1 illustrates a feeding system for a component mounting machine comprising a picking head 120. The feeding system is configured to handle a component tape 100 on which components 111 are arranged in adjacent compartments 101, 102. The components 111 may be e.g. electric components for the manufacture of printed circuit board assemblies and may all of the same kind for a specific tape, e.g. representing a frequently used component. The feeding system of FIG. 1 further comprises a feeding mechanism 130 according to an embodiment, including means of engagements, such as a pin 200 arranged to engage and disengage the component tape. The pin 200 of the feeding mechanism 130 is configured to engage perforations 300 (not shown in FIG. 1) of the component tape 100 at an engaging position 140 and transfer a linear motion along a feeding direction represented by the x-axis in FIG. 1 to the component tape towards the disengaging position 150. Thus, the pin 200 is configured to move in a linear motion between the engaging position 140 and the disengaging position 150. Thus, the pin 200 is configured to move in a direction that is parallel to the feeding direction F of the component tape 100. During the movement of the component tape 100 towards the disengaging position 150, the feeding mechanism 130 temporarily positions compartments 101, 102 of the component tape 100 at the picking position 110 for the component mounting machine picking head 120 to pick the components 111 and place them on the designated positions on the circuit board. The movement transferred from the feeding mechanism 130 to the component tape 100 may be stopped during the picking of components 111 by the picking head 120 to ensure accurate picking. Moreover, said feeding mechanism 130 is configured to provide at least two sequentially arranged compartments 101, 102 of the component tape 100 to the picking position 110 as it moves the component tape 100 between the engaging position 140 and the disengaging position 150. In an alternative example for which the feeding mechanism 130 provides more than two sequentially arranged compartments to the picking position 110, the distance between the engaging position 140 and the disengaging position 150 may become longer.

Figure 2:
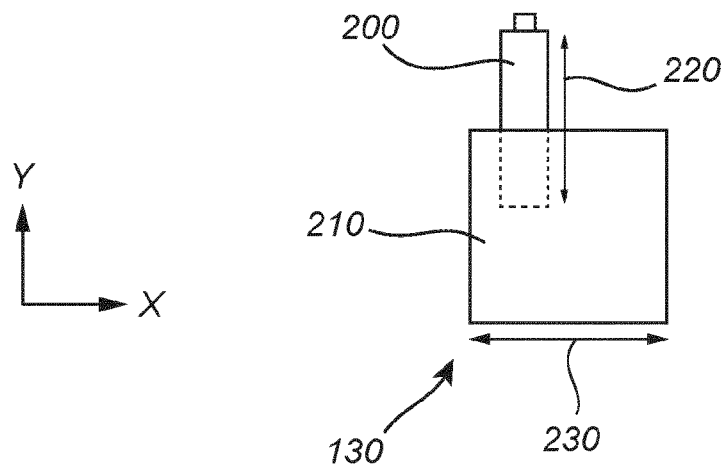
FIG. 2 shows a detailed view of the feeding mechanism according to an embodiment.

With reference to FIG. 2, an example of a feeding mechanism 130 is shown. The feeding mechanism 130 comprises a main structural body 210 and engagement means 200. Said engagement means may be a pin 200 arranged to engage perforations of the component tape 100. The pin may comprise a circular area of diameter similar to the one of the component tape perforations 300 to ensure stable connection between the feeding mechanism 130 and the component tape 100. In one example, an actuator may provide a vertical movement 220, represented by the y-axis in FIG. 2, to the pin 200 perpendicular to the feeding direction (represented by the x axis in FIG. 2). An ascending vertical movement provided by the actuator may allow the pin 200 to engage the perforations 300 of the component tape 100 at the engaging position 140. Similarly, a descending vertical movement provided by the actuator may allow the pin 200 to disengage the perforations 300 of the component tape 100 at the disengaging position 150. In addition, a further actuator may be arranged to provide a horizontal movement 230 of the main structural body 210 of the feeding mechanism 130 along the feeding direction (represented by the x-axis in FIG. 2). The further actuator may therefore provide a movement of the main structural body 210 of the feeding mechanism 130 from the engaging position 140 to the disengaging position 150 and back. In another example of this embodiment, the feeding mechanism 130 may comprise a plurality of engagement means e.g. two or more pins 200 configured to engage component tape perforations 300 on each side of a compartment 101.

Figure 3A:
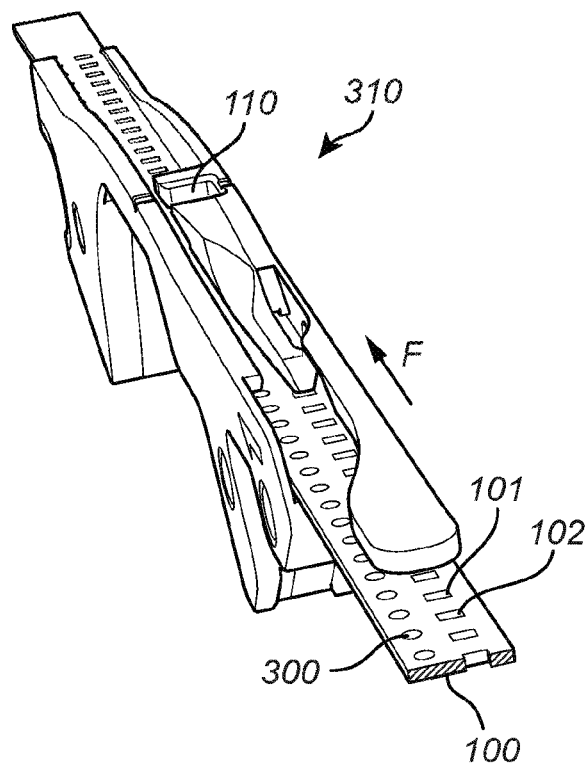
FIGS. 3 a-b illustrate different views of a feeding guide in which the composition of a component tape is shown along with the engaging position, disengaging position and the picking position.

FIG. 3a illustrates an example of a feeding guide 310 used for feeding components to a component mounting machine. The figure shows a component tape 100 inserted into the feeding guide 310 and directed towards the picking position 110 of the component mounting machine. In this example, the feeding mechanism (not shown) would be inserted in the open area beneath the feeding guide 310. The feeding mechanism would then move the component tape 100 along the feeding direction F of the feeding guide 310 and to the picking position 110.

Figure 3B:
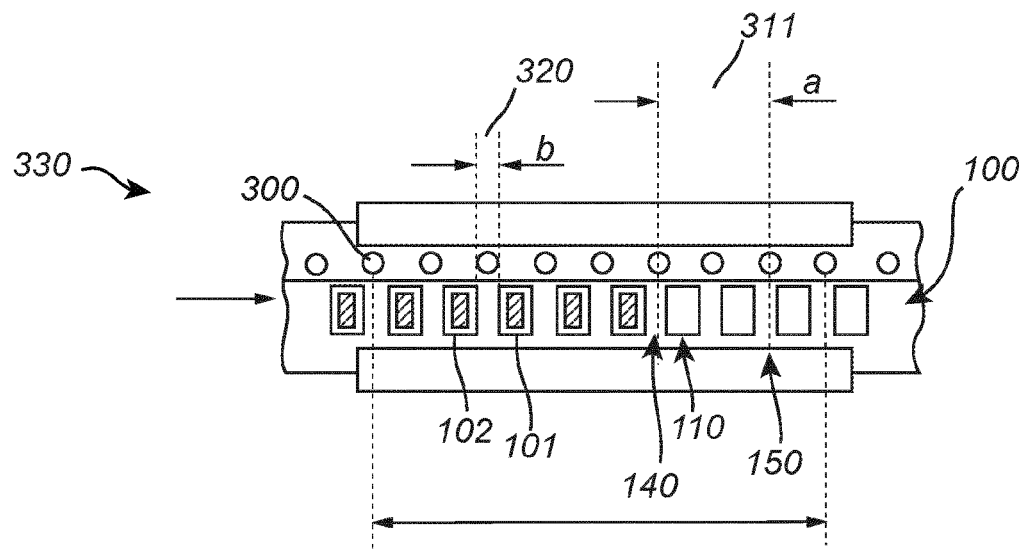

FIG. 3b illustrates a top view of this example of a portion (330) of the tape mounted on a feeding guide 310, which may be similar to the feeding guide in FIG. 3a. The component tape perforations 300, in which the feeding mechanism 130 engages and disengages the component tape 100, are shown as holes on the top part of the component tape 100 in the figure, and the compartments 101, 102, with the components 111 enclosed within, are shown on the lower part of the component tape 100 in the figure. In one example, a distance 311 between the engaging position 140 and the disengaging position 150 is defined as a multiple of the spacing distance 320 between adjacent compartments 101, 102 of the component tape 100. The spacing 320 of the compartments 101, 102 may together with a stroke length of the feeding mechanism define the number of compartments 101, 102 that can be fed to the picking position during a feeding cycle.

Figure 4:
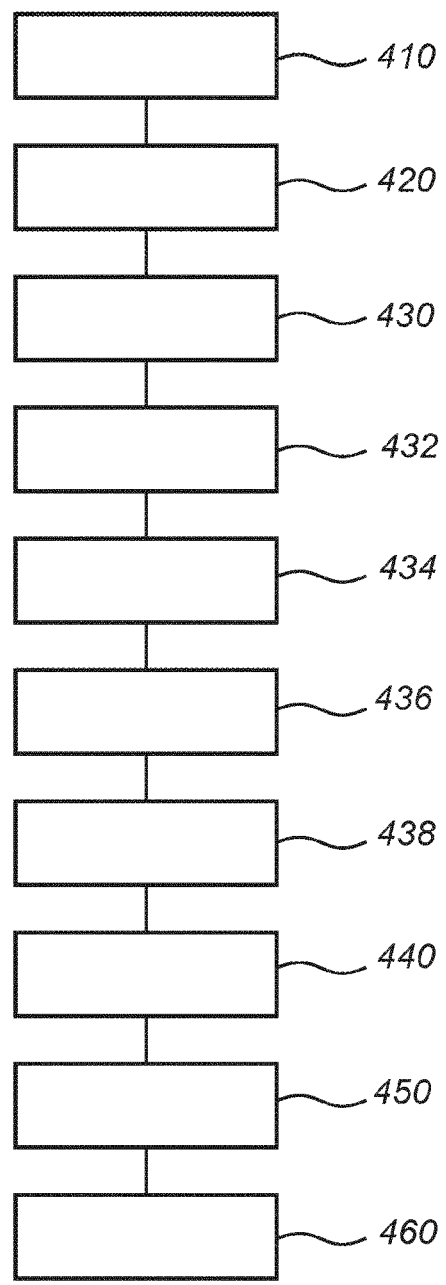
FIG. 4 illustrates the outline of a method for feeding a component tape to a picking position of a component mounting machine according to an embodiment.

FIG. 4 shows a schematic outline of the method according to an embodiment, wherein a feeding mechanism, which may be similarly configured as the embodiments discussed in connection with the previous figures, is configured to feed a component tape towards a picking position of a component mounting machine.

According to the present embodiment, the method may comprise the steps of positioning 410 the feeding mechanism at the engaging position and engaging 420 the component tape by an ascendant vertical movement of the engagement pin, induced by the second actuator, into the component tape perforations. The first actuator may then move 430 the feeding mechanism, and hence the component tape, from the engaging position towards a disengaging position. When positioned 440 at the disengaging position, and after the picking of at least two components by the component mounting machine (not shown in FIG. 4), the feeding mechanism may disengage 450 the component tape by descendent vertical movement of engagement pins, induced by the second actuator. The feeding mechanism then returns 460 to the engaging position from the disengaging position in a horizontal motion induced by the first actuator. The step of moving 430 the component tape from the engaging position to the disengaging position may be sufficiently long to position at least two compartments of the component tape at the picking position.

Optionally, the movement of the component tape may be stopped 432 when the first sequentially arranged compartment reaches the picking position to allow the component mounting machine to pick 434 the component enclosed in the first sequentially arranged compartment of the component tape. Once the component has been picked, the movement of the component tape is reinitiated and stopped again 436 when the second sequentially arranged compartment reaches the picking position. The component enclosed in the second sequentially arranged compartment is then picked 438 by the component mounting machine.

Figure 5:
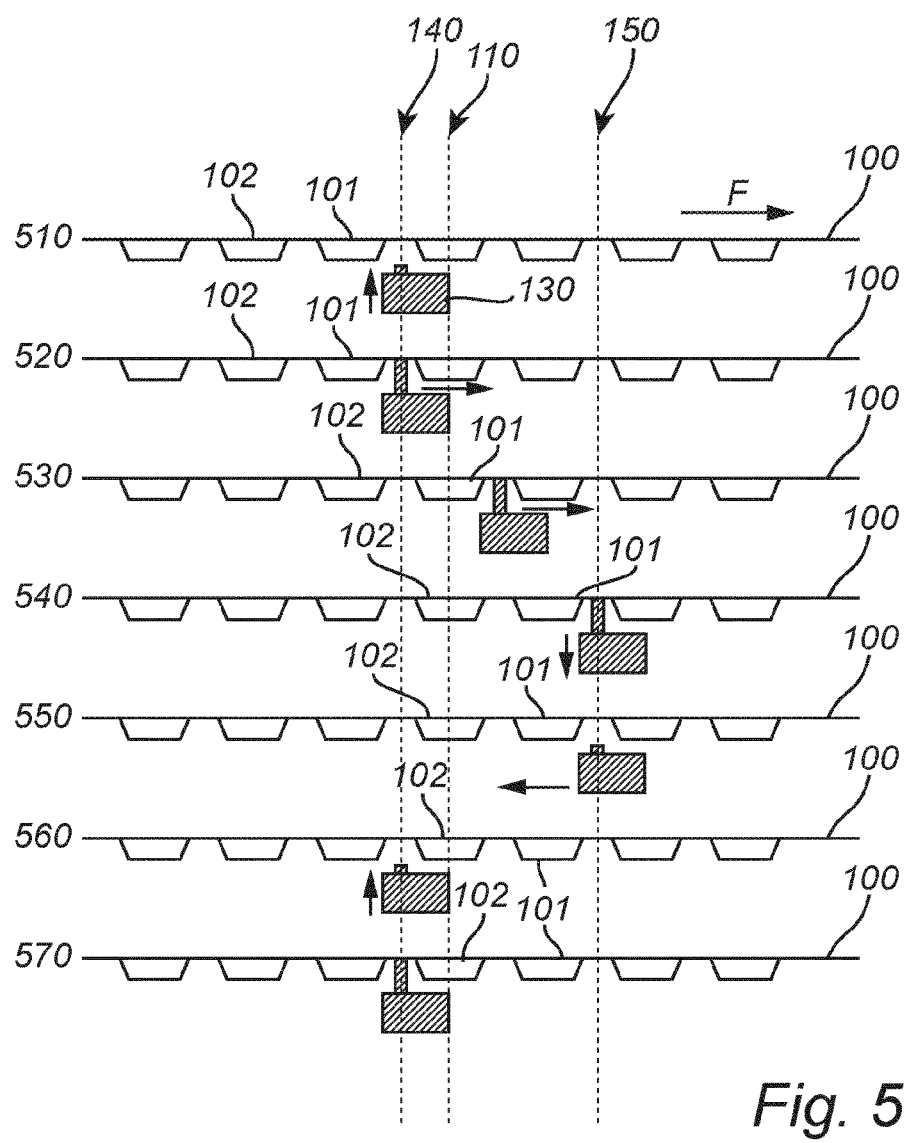
FIG. 5 illustrates the outline of a method for providing at least two sequentially arranged compartments to a picking position.

With reference to FIG. 5, there is shown graphically a feeding cycle performed by a feeding mechanism 130 according to an embodiment of the present inventive concept. The feeding mechanism 130 engages 510 the component tape 100 at the engaging position 140 (motions indicated by arrows) and moves 520 the component tape 100 along the feeding direction F from the engaging position 140 towards the picking position 110 such that a component can be picked from a first sequentially arranged compartment 101. The movement of the component tape 100 may then be resumed 530 as to position 540 a second compartment 102 at the picking position 110. The feeding mechanism 130 may then disengage 550 the component tape at the disengaging position 150 and complete the cycle by returning 560 from the disengaging position 150 to the engaging position 140, where the component tape 100 may be engaged 570 again and another cycle initiated. In the present example, the feeding mechanism 130 passes the picking position 110, which hence is arranged between the engaging position 140 and the disengaging position 150. Other examples are however conceivable, wherein the engaging position 140 and the disengaging position 150 are arranged at the same side of the picking position 110.

The invention claimed is:

1. A method of feeding a component tape towards a picking position of a component mounting machine by means of a feeding mechanism configured to engage the component tape at an engaging position and to disengage the component tape at a disengaging position, the method comprising:
engaging the component tape at the engaging position;
moving, by means of the feeding mechanism, the component tape from the engaging position to the disengaging position;
disengaging the component tape at the disengaging position; and
returning the feeding mechanism from the disengaging position to the engaging position,
wherein the feeding mechanism is configured to, during a feeding cycle, provide at least two sequentially arranged compartments of the component tape to the picking position before returning to the engaging position, wherein a distance between the engaging position and the disengaging position is determined by a number of sequentially arranged compartments that are provided to the picking position during the feeding cycle, and
wherein the feeding mechanism moves the component tape in a linear motion between the engaging position and the disengaging position.

2. The method according to claim 1, wherein the feeding mechanism comprises an engaging pin configured to engage and disengage perforations of the component tape.

3. The method according to claim 2, wherein said feeding mechanism is configured to move said engaging pin in a linear motion between the engaging position and the disengaging position.

4. The method according to claim 1, wherein the movement of the component tape is stopped during picking of a component at the picking position.

5. A non-transitory computer-readable medium storing computer-executable instructions for causing a feeding mechanism to execute the method according to claim 1.

6. A feeding mechanism for feeding a component tape towards a picking position of a component mounting machine, the feeding mechanism comprising:
an engagement means configured to engage the component tape at an engaging position and disengage the component tape at a disengaging position; and
an actuator configured to move the component tape from the engaging position towards the disengaging position, wherein the feeding mechanism is configured to, during a feeding cycle, provide at least two sequentially arranged compartments of the component tape to the picking position before returning to the engaging position, wherein a distance between the engaging position and the disengaging position is determined by a number of sequentially arranged compartments that are provided to the picking position during the feeding cycle, and wherein the feeding mechanism is configured to move the component tape in a linear motion between the engaging position and the disengaging position.

7. The feeding mechanism according to claim 6, wherein the engagement means comprises a pin for engaging perforations of the component tape.

8. The feeding mechanism according to claim 7, wherein the pin is configured to move perpendicularly to a feeding direction of the component tape to engage and disengage the component tape.

9. The feeding mechanism according to claim 6, wherein the feeding mechanism is configured to stop a movement of the component tape during picking of a component at the picking position.

10. The feeding mechanism according to claim 6, wherein the feeding mechanism is configured to move said engagement means in a linear motion between the engaging position and the disengaging position.

11. A component mounting machine comprising the feeding mechanism according to claim 6.

\* \* \* \* \*